United States Patent [19]

Resneau et al.

[11] 4,361,720
[45] Nov. 30, 1982

[54] LOW THERMAL RESISTANCE INSULATING SUPPORT AND BASE OR BOX FOR POWER COMPONENT INCORPORATING SUCH A SUPPORT

[75] Inventors: Jean-Claude Resneau; Jean Doyen; Robert Ribier, all of Paris, France

[73] Assignee: Thomson-CSF, Paris, France

[21] Appl. No.: 145,023

[22] Filed: Apr. 30, 1980

[30] Foreign Application Priority Data

May 2, 1979 [FR] France ................................ 79 11023

[51] Int. Cl.³ ............................................ H05K 7/20
[52] U.S. Cl. .......................... 174/16 HS; 174/52 FP; 357/81; 403/30
[58] Field of Search ...................... 174/52 FP, 16 HS; 357/81; 403/28, 30; 428/469

[56] References Cited

U.S. PATENT DOCUMENTS 4,227,036 10/1980 Fitzgerald ................... 174/52 FP X

FOREIGN PATENT DOCUMENTS 1439905 2/1969 Fed. Rep. of Germany .
1372216 10/1963 France .
1376243 9/1964 France .
903824 8/1962 United Kingdom .

*Primary Examiner*—B. A. Reynolds
*Assistant Examiner*—D. A. Tone
*Attorney, Agent, or Firm*—Oblon, Fisher, Spivak, McClelland & Maier

[57] ABSTRACT

A low thermal resistance insulating support permitting thermal stresses in the base of a high power component incorporating a beryllium oxide element without fractures or flaws occurring. The support includes a dissipating support made from copper, whose two large faces are slotted to at least partly house a beryllium oxide disk which receives a component and its connections to the outside. Such also completely houses a molybdenum disk with an expansion coefficient close to that of the beryllium oxide.

8 Claims, 3 Drawing Figures

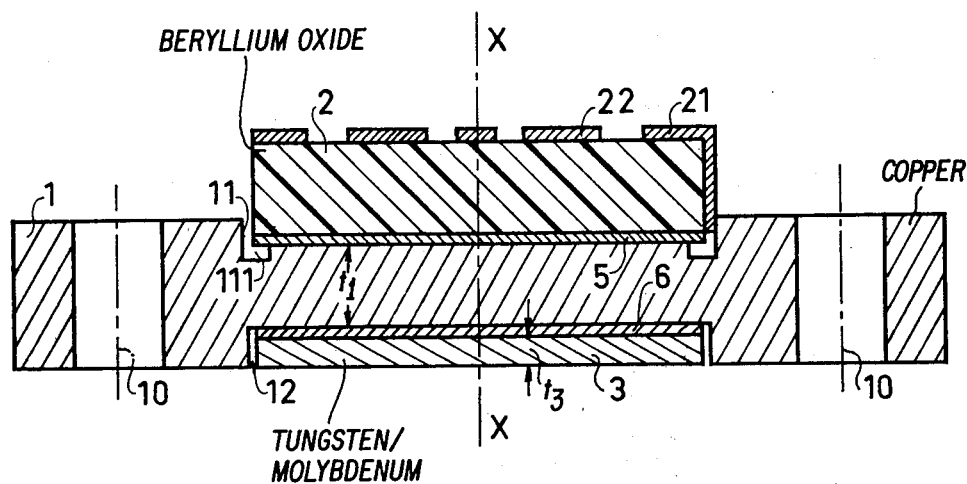
Fig. 1
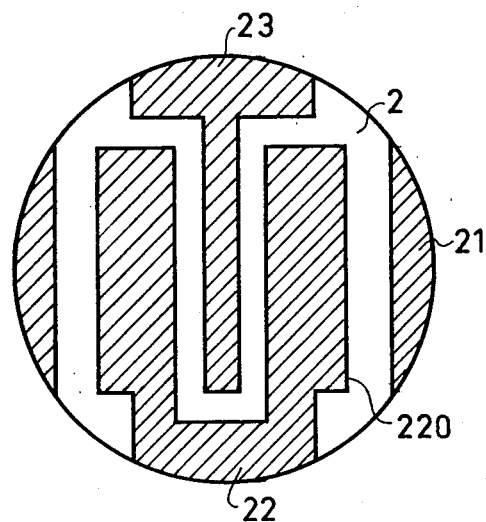
Fig. 2·a
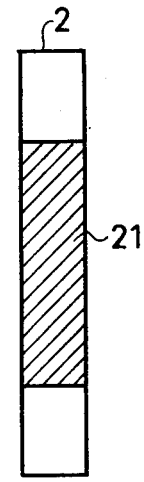
Fig. 2·b

LOW THERMAL RESISTANCE INSULATING SUPPORT AND BASE OR BOX FOR POWER COMPONENT INCORPORATING SUCH A SUPPORT

BACKGROUND OF THE INVENTION

1. Field of the Invention

The invention relates to a low thermal resistance insulating support, which can more particularly be used for a power component such as a diode or a high frequency transistor. The bases or boxes incorporating such a support form part of the invention.

2. Description of the Prior Art

In an electronic component having a relatively high power dissipation (from a few Watts to a few hundred Watts or even higher) a large amount of heat is produced in a small volume. To remove the heat, a dissipative support (the base) is used and is made from a metal which is a good conductor of heat and electricity, which is itself in contact with air or a cooling device.

Moreover, at high frequency (from a few dozen to a few hundred megahertz or even higher) the connections of the component must be very large compared with the dimensions of the semiconducting pellet or pellets constituting the active part of the component. These connections are not then directly connected to the pellet or pellets and instead are welded to metal coatings deposited on an electrically insulating and thermally conductive intermediate support, which is indispensible for electrically insulating from at least part of the connections, while still permitting the removal of the heat.

Beryllium oxide supplies a dielectric material whose thermal conductivity ($0.6$ cal.s$^{-1}$cm$^{-1}$) which is almost as good as that of gold ($0.7$ cal.s$^{-1}$cm$^{-1}$) and whose linear expansion coefficient ($7.7 \cdot 10^{-6}$) is matched to that of the silicon ($7.6 \cdot 10^{-6}$), so that the pellet can be directly welded to the beryllium oxide metal coating.

However, a problem arises on increasing the power up to and beyond 100 Watts over an area of about 1 cm$^2$. In order to improve heat removal, it has been attempted either to spread the semiconducting pellets over the metal conductive coating of the oxide so that the thermal cones intersect below the beryllium oxide, i.e. in the metal base or in cooling device, leading to large beryllium disks, or to reduce for an equivalent surface area the beryllium oxide thickness, which in the end leads to the same result.

In both cases, flaws occur in the beryllium oxide when using high temperature brazing with an alloy of silver and copper, which is the only reliable compatible alloy. On using low temperature brazing with so-called soft solders (alloy of lead, silver and indium) there are no BeO flaws, but the reliability is less satisfactory.

SUMMARY OF THE INVENTION

The object of the invention is to eliminate the risks of BeO flaws, while still permitting high temperature brazing due to the compression of the metal of the base between the BeO and a disk made from an appropriate metal.

The support according to the invention is of the type including a first element made from an electrically insulating and thermally conductive material welded to a second metal element with a higher expansion coefficient than that of the said material.

The invention is characterised by the fact that the second element is such that one large face thereof opposite to the face welded to the first element and parallel to the latter is itself welded to a metal member (molybdenum, tungsten, tantalum or metal alloy) whose linear expansion coefficient is equal to or lower than that of the material.

BRIEF DESCRIPTION OF THE DRAWINGS

Various other objects, features and attendant advantages of the present invention will be more fully appreciated as the same becomes better understood from the following detailed description when considered with the accompanying drawings in which like reference characters designate like or corresponding parts through the several views and wherein:

FIG. 1 is a diagrammatic sectional view of an embodiment of the invention;

FIG. 2a is a plan view and FIG. 2b is a profile view of part of the device of FIG. 1.

DETAILED DESCRIPTION OF THE PREFERRED EMBODIMENTS

In the embodiment of FIG. 1, a copper base 1 has a central portion with a rounded shape, which substantially revolves about an axis XX and has two lugs with cylindrical holes of axes 10.

In its central portion, base 1 is made thinner by two recesses 11 and 12, whose presence is not indispensible in the general case of the invention, so as to form a predetermined remaining thickiness $t_1$ therebetween. A beryllium oxide disk 2 is welded by a brazing disk 5 in the circular recess 11. A tungsten or molybdenum disk 3 is welded in recess 12 by a brazing disk 6 and has a thickness $t_3$ whose order of magnitude is substantially equivalent to that of the predetermined remaining thickness $t_1$ as shown in FIG. 1. Disk 2 clearly emerges from recess 11 and has metal coatings 21, 22, etc. One of these metal coatings covers part of the upper face of the disk, as well as part of its edge (see b in FIG. 2). Disk 3 is flush with and does not project beyond the face of base 1 adjacent thereto.

A circular release groove 111 is provided on the periphery of recess 11 and facilitates the compression of the central part of the base during a temperature rise through the action of the connecting forces between disks 2 and 3 and this part of base 1. Such prevents the hard solder from rising up onto the BeO disc 2.

FIG 2a shows the metallized face of the beryllium oxide disk 2 and FIG. 2b shows the edge of the metallized disk (hatched portion). This metallized portion constitutes the earth return of metal coating 21, also represented by hatching on the plan view.

The metal coating 21, 22 shown in an exemplified manner are appropriate for the fitting of a transistor having four identical pellets welded in pairs to the regions 220 of the widest metal coating. The same metal coating 22 includes in its peripheral portion a welding region for a wide connecting strip (not shown). This connection is for example that of the transistor collector in the case where the electrode is connected to the rear face of the pellet welded to the metal coating 22.

The two other input and/or output electrodes of the transistor are connected by connecting wires to metal coatings 21 and 23.

In the case of a transistor with a total power of 250 Watts, the dimensions of the essential parts are as follows:

base 1: centre diameter 14 mm, centre thickness 1.6 mm
disk 2: beryllium oxide: diameter 14 mm, thickness 1.6 mm
disk 3: molybdenum: diameter 14 mm, thickness 0.5 mm.

The device constituted by the assembled parts forms a base or a box. The actual box has a protective cover (not shown) covering the central portion, i.e. the pellets and the connecting wires which are particularly vulnerable.

Obviously, numerous additional modifications and variations of the present invention are possible in light of the above teachings. It is therefore to be understood that within the scope of the appended claims, the invention may be practiced otherwise than as specifically described herein.

What is claimed is:

1. A low thermal resistance insulating support comprising:
    a first element made from an electrically insulating and thermally conducting material and having a first face portion;
    a second element integrally connected to said first element at said first face portion and made from a metal with a higher expansion coefficient than that of said thermally conducting material of said first element;
    said second element having a first and second recess formed therein, and having a predetermined remaining thickness therebetween, said first recess being adjacent to the first face portion of said first element; and
    a metal member mounted in said second recess having an expansion coefficient close to that of said thermally conducting material, and having a thickness whose order of magnitude is substantially equivalent to said remaining thickness of said second element wherein said metal member is mounted within said second recess such that an outer surface portion thereof is flush with the surface of said second element.

2. A support according to claim 1, the first element comprising beryllium oxide and the metal member comprising molybdenum.

3. A support according to claim 1, the first element comprising beryllium oxide and said metal member comprising titanium.

4. A support according to claim 1, said metal member comprising a disk.

5. A support according to claim 1, the first element comprising beryllium oxide and the metal member comprising tungsten.

6. A support according to claim 1, the first element comprising beryllium oxide and said metal member comprising a metal alloy having an expansion coefficient equivalent to titanium.

7. A support according to claim 1, wherein said second element has a circular release groove provided therein on the periphery of said first recess of said second element.

8. A support according to claim 1, further comprising a plurality of metal coatings mounted on said first element.

* * * * *